(12) United States Patent
Lee

(10) Patent No.: US 7,709,745 B2
(45) Date of Patent: May 4, 2010

(54) CIRCUIT BOARD WITH PLATING BAR

(75) Inventor: Sheng-Yuan Lee, Taipei (TW)

(73) Assignee: VIA Technologies, Inc., Taipei (TW)

( * ) Notice: Subject to any disclaimer, the term of this patent is extended or adjusted under 35 U.S.C. 154(b) by 661 days.

(21) Appl. No.: 11/396,633

(22) Filed: Apr. 4, 2006

(65) Prior Publication Data
US 2007/0012476 A1 Jan. 18, 2007

(30) Foreign Application Priority Data
Jul. 1, 2005 (TW) .................................. 94122464

(51) Int. Cl.
*H05K 1/03* (2006.01)
(52) U.S. Cl. ...................... 174/255; 257/691; 324/158.1
(58) Field of Classification Search .................. 174/255; 257/691; 324/158.1
See application file for complete search history.

(56) References Cited
U.S. PATENT DOCUMENTS 4,850,883 A * 7/1989 Kabadi ........................ 439/67
5,386,088 A * 1/1995 Gardner ....................... 174/261
6,350,633 B1 * 2/2002 Lin .............................. 438/113
6,448,640 B2 * 9/2002 Corisis ........................ 257/691
7,002,226 B2 * 2/2006 Hsu et al. .................... 257/414
2004/0150388 A1 * 8/2004 Cheng et al. ............. 324/158.1
2004/0261263 A1 * 12/2004 Nelson et al. ................. 29/846

* cited by examiner

*Primary Examiner*—Jinhee J Lee
*Assistant Examiner*—Andargie M Aychillhum
(74) *Attorney, Agent, or Firm*—Birch, Stewart, Kolasch & Birch, LLP

(57) ABSTRACT

A circuit board includes a pad, a transmitting trace and a plating bar. The plating bar is used for forming an electroplating metallic layer on the pad, the pad and the transmitting trace are used for the signal transmission. Due to the plating bar causes a noise during the signal transmission, a dielectric layer having at least one opening is adjacent to at least one side of the plating bar to reduce the equivalent dielectric permittivity thereof and to maintain signal transmitting quality.

18 Claims, 5 Drawing Sheets

CIRCUIT BOARD WITH PLATING BAR

BACKGROUND OF THE INVENTION

1. Field of Invention

The present invention relates to a circuit board, and more particularly to a circuit board with plating bar.

2. Related Art

Accompanying to the development of corresponding technologies of electronic industry and the shrinkage in dimensions of the product, the IC designer and the IC manufacturers face to many challenges in process such a compact product. One of those challenges is more pads and conductive traces formed on the surface of the circuit board for signal or power transmission. In the conventional circuit board, a nickel/gold (Ni/Au) layer is generally covered on the surface of the pad. Thus, the golden wire and the pad of the circuit board are easily joined together during the wire bonding process. Similarly, the soldering pad, which is typically made of copper, of the packaging substrate is covered by the Ni/Au layer to prevent against oxidization and to improve the quality of electrical and mechanical connection of the solder balls.

The electroplating process is to form a metallic layer by electrolysis. A metal sheet for plating conductive layer acts as an anode, the electrolyte is an ion solution containing metallic ions, and the plated object acts as a cathode. The metallic ions in the electrolyte are attracted and moved to cathode after applying voltages to anode and cathode. The metallic ions are then plated on the plated object after reduction. In order to form the conductive layer, a plurality of plating bars are needed to be disposed on the circuit board for electrically connecting the pads with cathode through the plating bars.

As shown in FIGS. 1a and 1b, a conventional circuit board 100 has a plurality of pads 111 acting as electrical connections of the circuit board 100 and a device (not shown). The pad 111 is a wire bonding pad or a soldering pad, which may connect to another device on the same surface through a transmitting trace 112, and may also connect to a conductive via 150 through the transmitting trace 112 for connecting with an internal circuit of the circuit board 100.

As shown in FIG. 1b, the circuit board 100 includes four conductive layers and three dielectric layers 101, 102 and 103. The conductive layers are respectively isolated by one dielectric layer. In the prior art, the top conductive layer and the bottom conductive layer of the circuit board 100 are generally used for disposing signal layout and the pads 111. The intermediate conductive layers 120 and 130 act as the reference planes, for example the conductive layer 120 is a power plane and the conductive layer 130 is a ground plane. The circuit board 100 has a through hole 105. A conductive via 150 is formed by disposing a conductive material on side wall of the through hole 105 for electrically connecting between different conductive layers. The transmitting trace 112 is for example connected to a transmitting trace 141 on the other side of the circuit board 100 through the conductive via 150. A signal is thus transmitted to another device (not shown) through the signal transmitting structure including the pad 111, the transmitting trace 112, the conductive via 150 and the transmitting trace 141.

The pad 111 includes at least one electroplating metallic layer such as Ni/Au layer is formed by a plating process. In order to electrically connect the pad 111 to a plating electrode during the plating process, the signal transmitting path is connected to a plating bar 160. In FIG. 1a, the plating bar 160 is connected to the transmitting trace 112 or the conductive via 150. The plating bar 160 may be located at another conductive layer different from that of the pad 111. In FIG. 1b, a plating bar 160 on the power plane 120 is connected to a pad 111 through the conductive via 150. In addition, the plating bar 160 will also extend to an edge 104 of the circuit board 100.

However, the layout for a plurality of plating bars will occupy the available area for circuit layout. The signal transmitting path needs not to pass the plating bar in the signal transmitting structure, that is, the signal transmitting structure has an open stub. The open stub effect of redundant plating bars causes the impedance of the signal transmitting path is not matched during the application of high frequency, causes a noise during the signal transmission, and lowers signal transmitting quality.

In spite of other solutions have been disclosed in the prior art, which include forming the conductive layers without plating or removing the plating bars in the following process. However, these solutions cause the limitation to circuit design and the increasing to production cost. It is therefore an important subject of the present invention to provide a circuit board to reliably and effectively reduce the influence of the plating bar to the signal transmitting structure.

SUMMARY OF THE INVENTION

According to one embodiment of the present invention, a circuit board includes a dielectric layer, at least one pad, a transmitting trace and a plating bar. The pad, the transmitting trace and the plating bar are disposed on the dielectric layer. One end of the transmitting trace is connected to the pad. One end of the plating bar is located at an edge of the circuit board and another end of the plating bar is connected to the transmitting trace. The dielectric layer has at least one opening adjacent to at least one side of the plating bar.

According to another embodiment of the present invention, another circuit board includes a plurality of dielectric layers, at least one pad, a first transmitting trace, a plating bar and a conductive via. The dielectric layers have at least one first dielectric layer and at least one second dielectric layer. The first dielectric layer has at least one opening. The pad and the first transmitting trace are disposed on the first dielectric layer. The plating bar disposed on the second dielectric layer. One end of the first transmitting trace is connected to the pad. One end of the plating bar is located at an edge of the circuit board. The conductive via passes through the dielectric layers and electrically connects to the first transmitting trace and the plating bar. The opening is adjacent to at least one side of the plating bar.

BRIEF DESCRIPTION OF THE DRAWINGS

The present invention will become more fully understood from the detailed description given herein below illustration only, and thus is not limitative of the present invention, and wherein:

FIG. 1b is a cross-sectional view showing the conventional signal transmitting structure of a circuit board along A-A' in FIG. 1a;

FIG. 2b is a cross-sectional view showing the signal transmitting structure of a circuit board according to a preferred embodiment of the present invention along B-B' in FIG. 2a; and FIG. 2c is another cross-sectional view showing the signal transmitting structure of a circuit board according to a preferred embodiment of the present invention along C-C' in FIG. 2a.

DETAILED DESCRIPTION OF THE INVENTION

The present invention will be apparent from the following detailed description, which proceeds with reference to the accompanying drawings, wherein the same references relate to the same elements.

The present invention provides a circuit board including a signal transmitting structure and at least one dielectric layer. One of the dielectric layers has at least one opening adjacent to a plating bar of the signal transmitting structure.

Figure 1A:
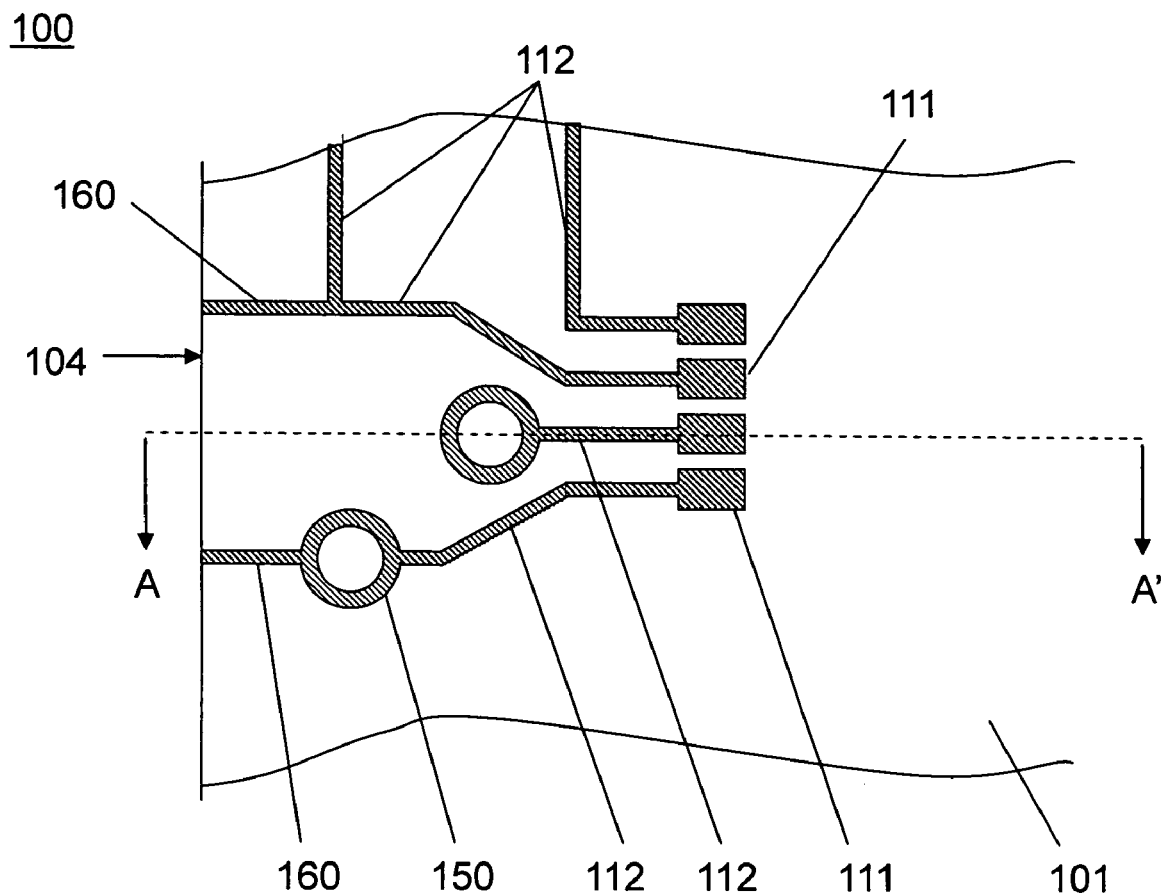
FIG. 1a is a top view showing a conventional signal transmitting structure of a circuit board.
Figure 1B:
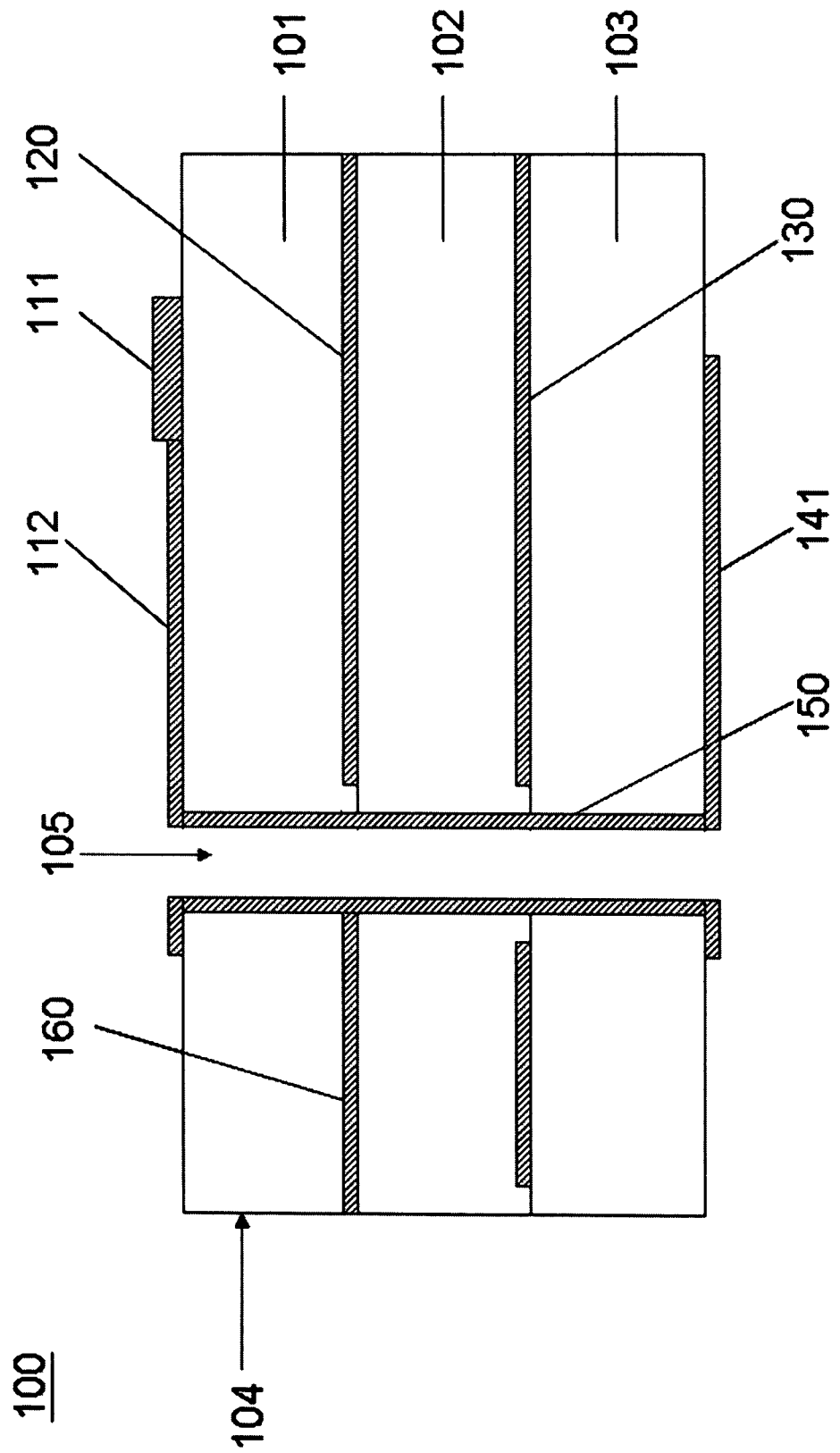
Figure 2A:
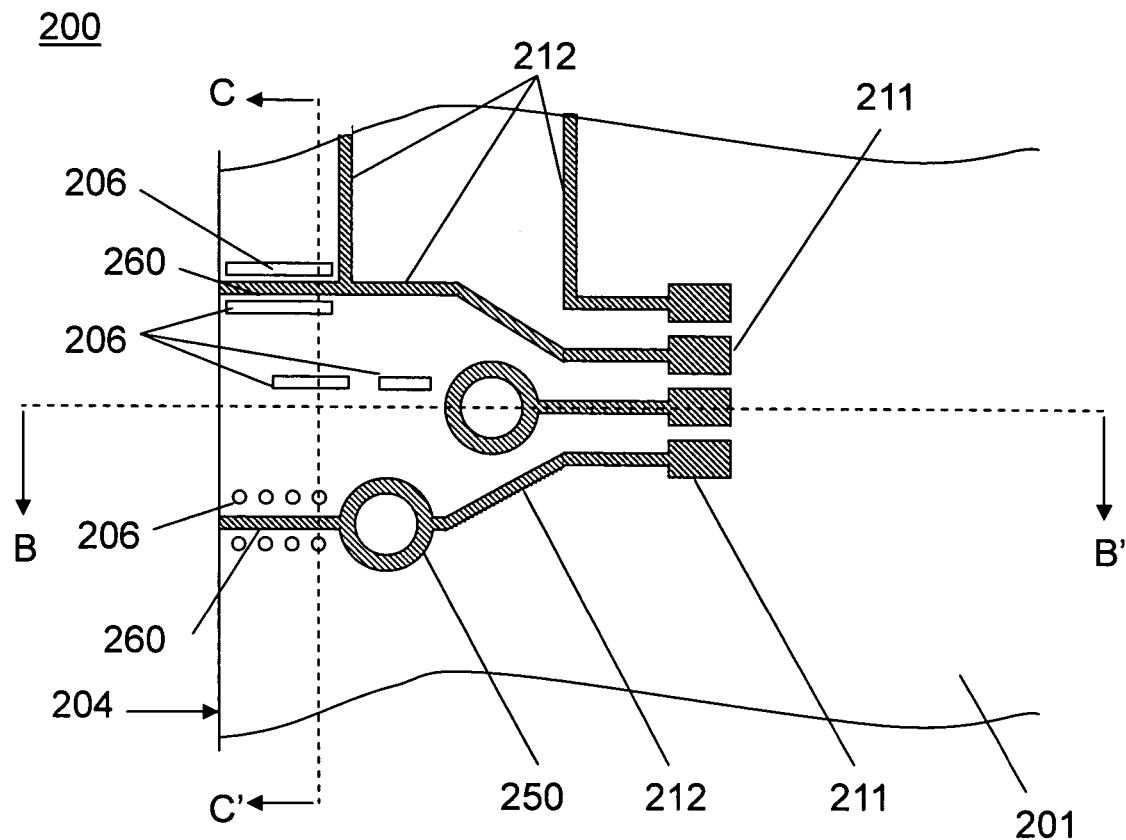
FIG. 2a is a top view showing a signal transmitting structure of a circuit board according to a preferred embodiment of the present invention.
Figure 2B:
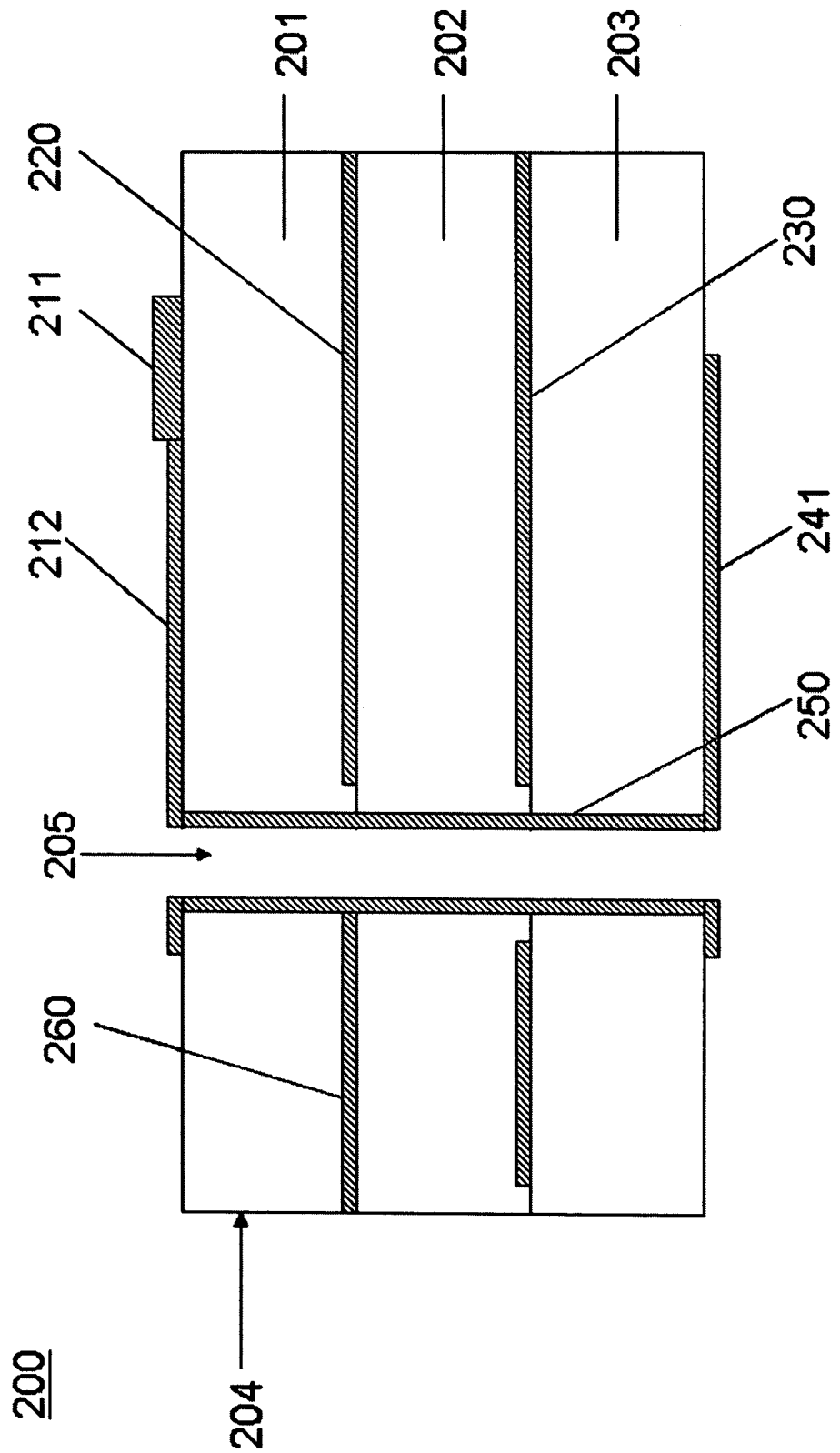
Figure 2C:
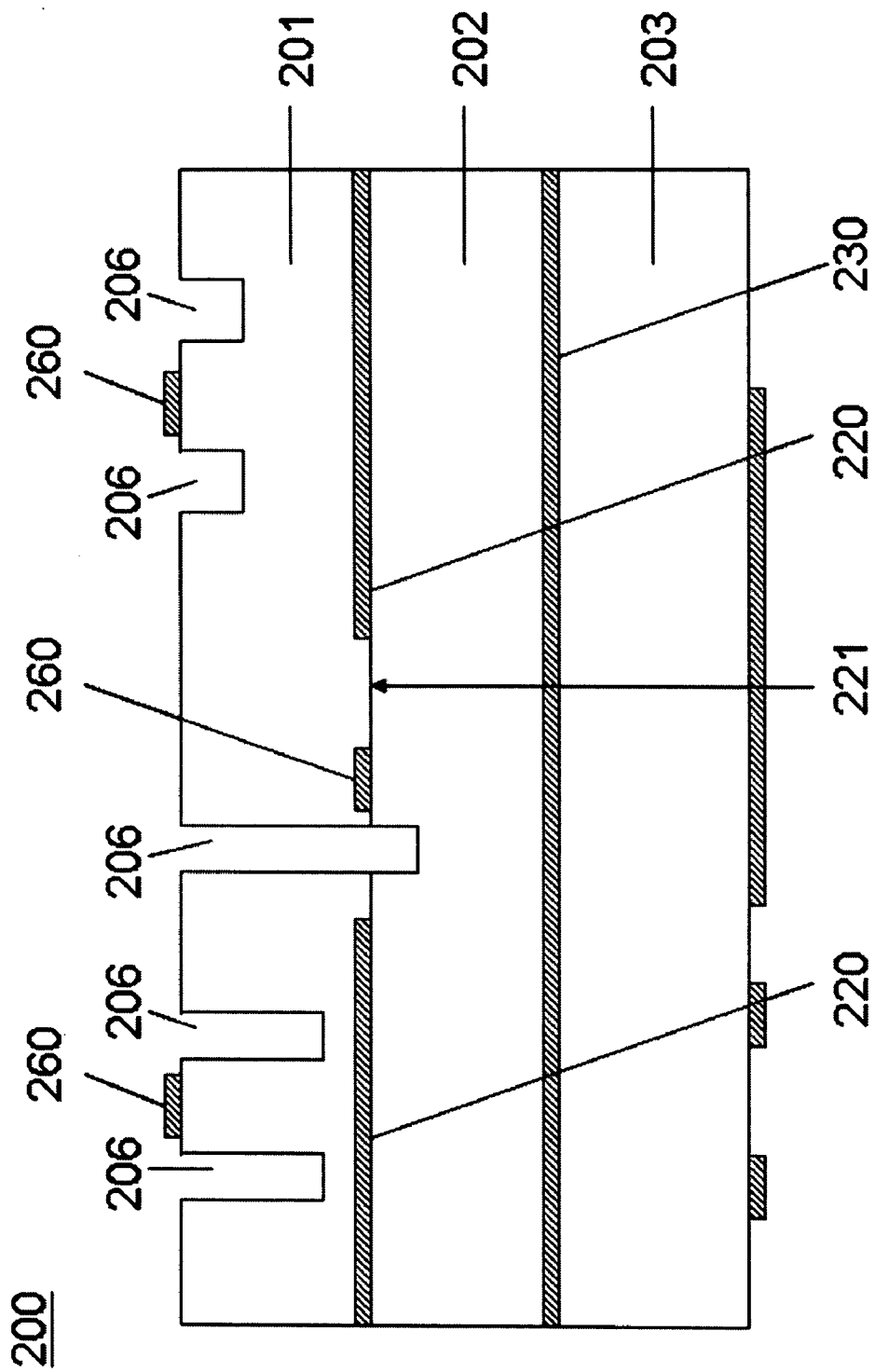

Referring to FIGS. 2a to 2c, a preferred embodiment of a circuit board 200 includes four conductive layers. The conductive layers are respectively isolated by the dielectric layers 201, 202 and 203. The conductive layer sandwiched between two dielectric layers maybe act as the reference plane, for example the conductive layer 220 is a power plane and the conductive layer 230 is a ground plane. As shown in FIG. 2a, a plurality of pads 211 are disposed on a surface of the circuit board 200 for electrically connecting to a device such as a chip (not shown). A pad 211 is connected to another device on the same surface through a transmitting trace 212. As shown in FIGS. 2a and 2b, a pad 211 is connected to a conductive via 250 through a transmitting trace 212 for connecting with a transmitting trace 241 on another conductive layer. The conductive via 250 is a conductive structure formed on side wall of a through hole 205 of the circuit board for passing through the dielectric layers 201, 202 and 203 and electrically connecting between different conductive layers. A signal generated from the device may be transmitted to an external device through the signal transmitting structure of the circuit board 200. The signal transmitting structure includes the pad 211 and the transmitting trace 212. In addition, the signal transmitting structure may further include the conductive via 250.

The pad 211 has at least one electroplating metallic layer formed by a plating process. In order to enable the pads 211 being electrically connected to a plating electrode by the plating process, the signal transmitting structure may further include a plating bar 260 extending from the signal transmitting structure to an edge 204 of the circuit board 200. Thus, the edge 204 of the circuit board 200 may electrically connect to the plating electrode through any one conductive trace. In FIG. 2a, the plating bar 260 may extend from the transmitting trace 212 to the edge 204 of the circuit board 200. Alternatively, the plating bar 260 may extend from the conductive via 250 to the edge 204 of the circuit board 200. In addition, the plating bar 260 may be disposed within any one of the conductive layers. As shown in FIG. 2b, the power plane 220 has a plating bar 260 extending from the conductive via 250 to the edge 204 of the circuit board 200. However, the plating bar 260 cannot electrically connect to the power plane 220. As shown in FIG. 2c, the power plane 220 has a non-conductive area 221 surrounding the plating bar 260 to isolate the plating bar 260 with the power plane 220.

The dielectric layer 201 has at least one opening 206 adjacent to the plating bar 260. The opening 206 may be formed by mechanically removing a portion of the dielectric layer, for example a shaving process or a drilling process. Alternatively, a laser removing process or an etching process may be used to form the opening 206 on the dielectric layer. Preferably, the closer the opening 206 to the plating bar 260 will be the better within process window. The shape of the opening 206 may be such as at least one slot or a plurality of holes, disposed adjacent to both side of the plating bar 260.

As shown in FIG. 2c, when the plating bar 260 is located on the surface of the circuit board 200, the opening 206 may pass through the dielectric layer 201 or be a hollow portion on the dielectric layer 201. When the plating bar 260, for example which is on the dielectric layer 202, is located within the circuit board 200, the opening 206 may be on the dielectric layer 201 and the dielectric layer 202. That is, the dielectric layer 201 and the dielectric layer 202 respective have the opening 206. The opening 206 of the dielectric layer 201 may be connected to the opening 206 of the dielectric layer 202, and which are simultaneously formed by a same process.

In order to protect the circuits on the circuit board 200, an anti-oxidization layer or a solder mask layer (not shown) may be formed on the surface of the circuit board 200. The opening 206 may be formed by removing a portion of the anti-oxidization layer or the solder mask layer; and then removing a portion of the dielectric layer after forming the anti-oxidization layer or the solder mask layer.

The circuit board 200 has at least one signal transmitting structure for providing a signal transmitting path between two devices. The signal transmitting structure includes a pad 211 and a transmitting trace 212. The pad 211 has at least one electroplating metallic layer formed by a plating process and is used for electrically connecting to a device. In order to enable the pads 211 being electrically connected to a plating electrode by the plating process, the signal transmitting structure connected with a plating bar 260 is extended from the signal transmitting structure to an edge 204 of the circuit board 200 for connecting to the plating electrode. In other words, the signal transmitting structure includes at least one conductive layer formed by the plating process while the signal transmitting structure is connected with a plating bar.

However, the transmitting path needs not to pass the plating bar 260 for a signal. One end of the plating bar 260 is electrically connected to the signal transmitting structure, and the other end of the plating bar 260 located at the edge of the circuit board 200 is not connected to other device. The plating bar 260 may be deemed as an open stub of the signal transmitting structure. In a practical layout, the disposition of the plating bars 260 is disposed at an unused space of the circuit layout. The length of the plating bars 260 is thus different. In addition, the longer the plating bar 260 is, the lower the resonance frequency possessed. The resonance frequency of the plating bar 260 will cause a noise during the signal transmission. The longer the plating bar 260 is, the lower the effective operation frequency of the signal transmitting structure possessed. By disposing the opening 206 on the dielectric layer, the present invention can reduce the equivalent dielectric permittivity of the dielectric layer adjacent to the plating bar, raise the resonance frequency of the plating bar, raise effective operation frequency of the signal transmitting structure, and maintain signal transmitting quality.

The shape and location of the opening 206 will influence the open stub effect generated from the plating bar and cause the impedance of the signal transmitting path is not matched. In this embodiment, the shape and location of the opening are not limitative. Any opening formed on the dielectric layer and beside the plating bar for reducing the equivalent dielectric permittivity of the dielectric layer will fall within the scope of the present invention.

In summary, the present invention provides a circuit board including a signal transmitting structure and at least one dielectric layer. A portion of the signal transmitting structure is formed by a plating process, and the signal transmitting structure is thus electrically connected to a plating electrode through a plating bar. The plating bar is formed on a dielectric layer which has an opening adjacent to the plating bar. By applying the opening, the present invention achieves excellent functions and results as follows:

1. The opening adjacent to the plating bar provides a lower dielectric permittivity and thus raises the resonance frequency of the plating bar;
2. The opening adjacent to the plating bar influences the open stub effect generated from the plating bar and causes the impedance of the signal transmitting path is not matched;
3. The opening adjacent to the plating bar raises the frequency of the antenna effect generated from the plating bar, improves the noise to the signal transmitting structure, and maintains signal transmitting quality;
4. As to the shape, location and depth of the opening on the dielectric layer is designed in accordance with the resonance effect generated from the plating bar, the present invention provides a method for elastic design; and
5. The present invention can be applied to other similar circuit board such as a printed circuit board or a packaging substrate.

Although the present invention has been described with reference to specific embodiments, this description is not meant to be construed in a pivoting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A circuit board, comprising:
a dielectric layer having at least one opening; at least one pad disposed on the dielectric layer; a transmitting trace disposed on the dielectric layer, one end of the transmitting trace is connected to the pad; and a plating bar disposed on the dielectric layer, only one end of the plating bar is connected to the transmitting trace while another end of the plating bar is located at an edge of the circuit board without any connection, such that the plating bar is an open stub of a signal transmitting structure, wherein the opening is a hollow portion, and the opening is adjacent to at least one side of the open stub of the signal transmitting structure and influences the open stub effect generated from the plating bar and the case that an impedance of a signal transmitting path is to be not matched.

2. The circuit board according to claim 1, wherein the opening has at least one slot.

3. The circuit board according to claim 1, wherein the opening has a plurality of holes.

4. The circuit board according to claim 1, wherein the opening is formed by an etching process, a mechanical removing process or a laser removing process.

5. The circuit board according to claim 1, wherein the pad is located at least one surface of the circuit board.

6. The circuit board according to claim 1, wherein the circuit board is a printed circuit board or a packaging substrate.

7. The circuit board according to claim 1, wherein the opening passes through the dielectric layer.

8. The circuit board according to claim 1, wherein the pad comprises at least one electroplating metallic layer.

9. A circuit board, comprising:
a plurality of dielectric layers having at least one first dielectric layer and at least one second dielectric layer, the first dielectric layer has at least one first opening; at least one pad disposed on the first dielectric layer; a first transmitting trace disposed on the first dielectric layer, one end of the first transmitting trace is connected to the pad; a plating bar disposed on the second dielectric layer; and a conductive via passing through the dielectric layers and electrically connecting to the first transmitting trace and the plating bar, wherein the first opening is adjacent to at least one side of the plating bar, only one end of the plating bar is connected to the conductive via while another end of the plating bar is located at an edge of the circuit board without any connection, such that the plating bar is an open stub, and wherein the second dielectric layer has at least one second opening adjacent to the open stub of the signal transmitting structure and influences the open stub effect generated from the plating bar and the case that an impedance of a signal transmitting path is to be not matched.

10. The circuit board according to claim 9, wherein the first opening and the second opening have at least one slot.

11. The circuit board according to claim 9, wherein the first opening and the second opening have a plurality of holes.

12. The circuit board according to claim 9, wherein the first opening and the second opening are formed by an etching process, a mechanical removing process or a laser removing process.

13. The circuit board according to claim 9, wherein the first transmitting trace is a signal transmitting trace.

14. The circuit board according to claim 9, wherein the second opening of the second dielectric layer is connected to the first opening of the first dielectric layer.

15. The circuit board according to claim 9, wherein the pad is located at least one surface of the circuit board.

16. The circuit board according to claim 9, wherein the circuit board is a printed circuit board or a packaging substrate.

17. The circuit board according to claim 9, further comprising:
a third dielectric layer; and
a second transmitting trace disposed on the third dielectric layer, the conductive via is used for electrically connecting to the first transmitting trace and second transmitting trace.

18. The circuit board according to claim 9, wherein the pad comprises at least one electroplating metallic layer.

* * * * *